United States Patent [19]
Watanabe

[11] Patent Number: 5,654,578
[45] Date of Patent: Aug. 5, 1997

[54] SUPERLATTICE AVALANCHE PHOTODIODE WITH MESA STRUCTURE

[75] Inventor: Isao Watanabe, Tokyo, Japan

[73] Assignee: NEC Corporation, Japan

[21] Appl. No.: 576,649

[22] Filed: Dec. 21, 1995

[30] Foreign Application Priority Data

Dec. 22, 1994 [JP] Japan ................................. 6-335438

[51] Int. Cl.$^6$ ..................... H01L 31/107; H01L 31/075; H01L 31/105; H01L 31/117
[52] U.S. Cl. ............................................. 257/438; 257/458
[58] Field of Search ................................. 257/438, 458

[56] References Cited

U.S. PATENT DOCUMENTS

| | | | |
|---|---|---|---|
| 5,075,750 | 12/1991 | Kagawa | 257/438 |
| 5,338,947 | 8/1994 | Watanabe | 257/438 |
| 5,552,629 | 9/1996 | Watanabe | 257/438 |

FOREIGN PATENT DOCUMENTS

| | | | |
|---|---|---|---|
| 57-111070 | 7/1982 | Japan | 257/438 |
| 62-266880 | 11/1987 | Japan | 257/438 |

OTHER PUBLICATIONS

F. Capasso, W.T. Tsang, A. L. Hutchinson, and G. F. Williams, Enhancement of electron impactionization in a superlaticce: A New avalance photoiode with a large ionization rate ratio, Bell Laboratories, Murray Hill, New Jersey, Sep. 29, 1981, pp. 38–40.

Toshiaki Kagawa, Yuichi Kawamura and Hidetoshi Iwamura, InGaAsP–InAlAs Superlattice Avalance Photodiode, IEEE Journal of Quantum Electronics, vol. 28, No. 6, Jun. 1992, pp. 1419–1423.

H. Nakamura, S. Hanatani, S. Tanaka, T. Notsu, H. Nakano and K. Ishida, An InGaAs/InAlAs Superlattice Avalanche Photodiode with Thin Well Width for 10Gb/s Optical Transmission Systems, Central Research Laboratory, Hitachi Ltd., Tokyo, pp. 261–264.

Multiplication–Dependent Frequency Response of inP/InGaAs Avalanche Photodiode, Electronics Letters, vol. 20, No. 9, Apr. 26, 1984, pp. 373–374.

*Primary Examiner*—Stephen Meier
*Attorney, Agent, or Firm*—Laff, Whitesel, Conte & Saret, Ltd.

[57] ABSTRACT

A superlattice avalanche photodiode with a mesa structure is provided, which enables to keep its noise characteristic low for a long time without decreasing the dynamic range for high-speed response. The photodiode has a semiconductor superlattice carrier multiplication layer, a first semiconductor electric-field buffer layers of a first conductivity type formed on one side of the carrier multiplication layer, and a second semiconductor electric-field buffer layer of a second conductivity type formed on the other side of the carrier multiplication layer. The photodiode further has a semiconductor light-absorbing layer of the second conductivity type formed on the second electric-field buffer layer. At least the light-absorbing layer constitutes the mesa structure. The first electric-field buffer layer is made of a central part and a peripheral part surrounding the central part. The peripheral part has a greater electric-field relaxation effect than that of the central part. The interface damage of the light-absorbing layer is restrained through the difference of the electric-field relaxation effect.

12 Claims, 7 Drawing Sheets

SUPERLATTICE AVALANCHE PHOTODIODE WITH MESA STRUCTURE

BACKGROUND OF THE INVENTION

1. Field of the Invention

The present invention relates to a superlattice avalanche photodiode and more particularly, to a superlattice photodiode with the mesa structure which has a semiconductor superlattice carrier multiplication layer and semiconductor electric-field buffer layers disposed at each side of the carrier multiplication layer.

2. Description of the Prior Art

High-speed response, low dark current and high-reliability semiconductor photodetectors are essentially required for high-speed, high-sensitivity and high-reliability optical communications systems.

Recently, since silica optical fibers have the low-loss wavelength region of 1.3 to 1.6 µm, InP/InGaAsP avalanche and pin photodiodes that enables to improve their operation speed and sensitivity within this wavelength region have been actively researched and developed.

The InP/InGaAsP avalanche photodiodes that have been put into practical use have the gain-bandwidth (GB) product of approximately 40 to 80 GHz and the maximum gain bandwidth of approximately 8 GHz.

However, with the conventional InP/InGaAsP avalanche photodiodes, the InP avalanche carrier multiplication layer has a small ionization rate ratio ($\alpha/\beta$) of approximately 2, where $\alpha$ is an impact ionization rate of electrons and $\beta$ is an impact ionization rate of holes. Therefore, the conventional InP/InGaAsP avalanche photodiodes have a GB product limited to about 80 GHz or lower and a large excessive noise factor X of 0.7, which means that they have a limit of enhancement in operation speed and sensitivity without noise increase.

This limit applies to the other conventional photodetectors having multiplication layers made of a bulk III-V compound semiconductor.

As a result, to realize a low-noise avalanche photodiode with an increased GB product, it is necessary to artificially increase the ratio ($\alpha/\beta$) of the hole and electron ionization rates or coefficients.

To realize the artificial increase of the ratio ($\alpha/\beta$), a conventional improved avalanche photodiode was developed by F. Capasso et al., which was disclosed in Applied Physics Letters, Vol. 40, No. 1, pp 38–pp 40, 1982. In this photodiode, the energy discontinuity $\Delta Ec$ of superlattice semiconductor layers in the conduction band is utilized to artificially increase the impact ionization increase of electrons.

Practically, an ionization rate ratio increase was confirmed for the GaAs/GaAlAs superlattice structure. Specifically, ($\alpha/\beta$)=8 was obtained for the GaAs/GaAlAs superlattice structure, while ($\alpha/\beta$)=2 for the bulk GaAs.

Also, another conventional improved avalanche photodiode was developed by Kagawa et al., which was disclosed in Journal of Quantum Electronics, Vol. 28, No. 6, pp 1419–pp 1423, 1992. This photodiode has an InGaAsP/InAlAs superlattice structure similar to that of Capasso et al.. The InGaAsP/InAlAs superlattice structure is sensitive to light with 1.3 to 1.6 µm wavelength which has been employed in the long-distance optical communications. ($\alpha/\beta$)=10 was obtained for the InGaAsP/InAlAs superlattice structure, while ($\alpha/\beta$)=2 for the bulk InGaAs.

Figure 1:
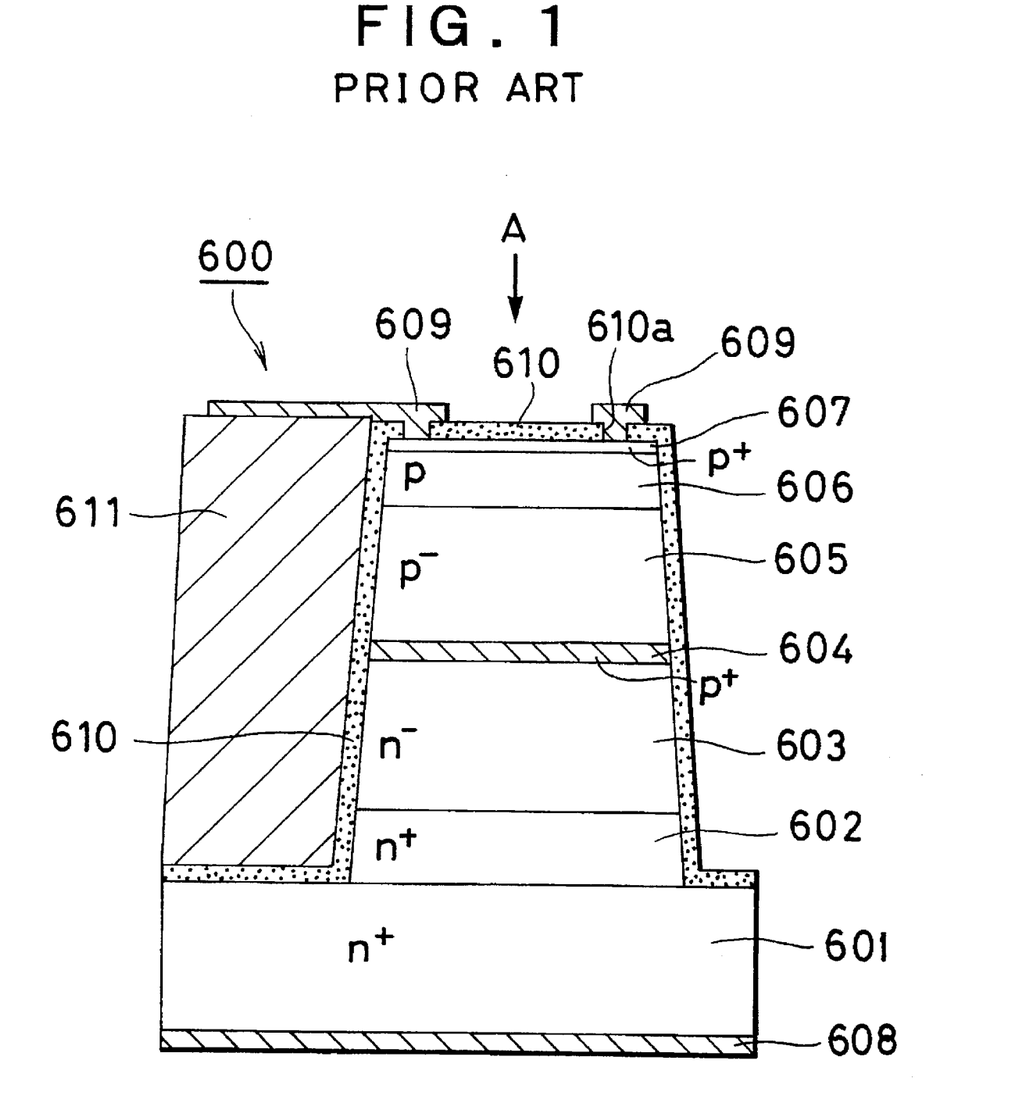
FIG. 1 is a partial cross-sectional view of a conventional superlattice avalanche photodiode.

FIG. 1 shows a cross-section of the conventional improved avalanche photodiode developed by Kagawa et al.. In FIG. 1, the photodiode 600 has an $n^+$-InP buffer layer 602 formed on an $n^+$-InP substrate 601. An $n^-$-InGaAsP/InAlAs superlattice carrier multiplication layer 603 is formed on the $n^+$-InP buffer layer 602. A $p^+$-InP electric-field buffer layer 604 is formed on the $n^-$-InGaAsP/InAlAs superlattice carrier multiplication layer 603. A $p^-$-InGaAs light-absorbing layer 605 is formed on the $p^+$-InP electric-field buffer layer 604. A $p^+$-InP cap layer 606 is formed on the $p^-$-InGaAs light-absorbing layer 605. A $p^+$-InGaAs contact layer 607 is formed on the $p^+$-InP cap layer 606. These stacked semiconductor layers 602, 603, 604, 605, 606 and 607 constitute a mesa structure.

The surface of the mesa structure and the exposed surface of the substrate 601 are covered with a SiN passivation film 610. The passivation film 610 has a contact hole 610a on the top of the mesa structure. A polyimide film 611 is formed on the SiN passivation film 610 to bury a depression formed adjacent to the mesa structure.

A p-side electrode 609 is formed on the polyimide film 611 and the SiN passivation film 610 to be in Ohmic contacted with the $p^+$-InGaAs contact layer 607 through the contact hole 610a.

an n-side electrode 608 is formed on the back surface of the substrate 601 to be in Ohmic contacted therewith.

The semiconductor layers 602, 603, 604, 605, 606 and 607 constituting the mesa structure are epitaxially and successively grown by a gas-source molecular beam epitaxy (MBE).

With the conventional superlattice avalanche photodiode shown in FIG. 1, the conduction band edge discontinuity $\Delta Ec$ is 0.39 eV and the valence band edge discontinuity $\Delta Ev$ is 0.03 eV, which means that $\Delta Ec$ is greater than $\Delta Ev$. Therefore, an obtainable energy for electrons due to the conduction band edge discontinuity is greater than that for holes due to the valence band edge discontinuity. Therefore, the electrons reach their ionization threshold energy more readily than for the holes, thereby increasing the ionization rate of the electrons. As a result, the ionization rate ratio ($\alpha/\beta$) can be increased and therefore, the noise can be relatively decreased.

Further, still another conventional improved avalanche photodiode was developed by Nakamura et al., which was disclosed in ECOC, TuC5-4, pp 261–pp 264, 1991. This photodiode has a mesa structure containing an InGaAs/InAlAs superlattice structure similar to that of FIG. 1. The surface of the mesa structure is covered with a polyimide film to be contacted therewith.

The conventional avalanche photodiode shown in FIG. 1 has the following problem:

Interfacial states and crystal defects exist at the interfaces of the carrier multiplication layer 603, electric-field buffer layer 604 and light-absorbing layer 605 with the passivation film 610 and in their vicinity. The interfacial states and crystal defects tend to increase due to an applied bias voltage on a high-temperature reliability test and/or a normal operation with the increasing operation time, which leads to increase in leakage current. Accordingly, an existing dark current becomes from 0.8 µA to several microamperes or greater to raise the noise level.

As a result, a problem that the raised noise level due to the dark current increase tend to cancel the noise reduction effect caused by the ionization rate ratio improvement occurs.

The above interfacial state increase is produced by the following reasons:

Typically, there are interfacial states at the interfaces of the semiconductor layers 602, 603, 604, 605, 606 and 607 and the passivation film 610, the number of which is $2 \times 10^{12}/cm^2 \cdot eV$. These interfacial states are grouped into some types.

One of the types of the interfacial states is due to dangling bonds generated at the interfaces of the semiconductor layers 602, 603, 604, 605, 606 and 607 with the passivation film 610 during ordinary fabrication processes for growing the layers 602, 603, 604, 605, 606 and 607.

Another type of the interfacial states is due to dangling bonds generated at the interfaces of the semiconductor layers 602, 603, 604, 605, 606 and 607 with native oxide films formed thereon after the formation process of the mesa structure.

Still another type of the interfacial states is caused by the crystal defects existing on the surfaces of the semiconductor layers 602, 603, 604, 605, 606 and 607.

The semiconductor layers 603, 604 and 605 are depleted by an applied reverse bias voltage. Since the p$^-$-InGaAs light-absorbing layer 605 has the smallest band gap within the three layers 603, 604 and 605, it is considered that the major energy levels are caused by the dangling bonds existing at the interface of the light-absorbing layer 605 and the passivation film 610.

Also, since the n$^-$-InGaAsP/InAlAs superlattice multiplication layer 603 contains aluminum (Al) atoms having a tendency of producing a native oxide, it is considered that the major energy levels are caused by the dangling bonds existing at the interface of the multiplication layer 603 and the passivation film 610.

When the conventional photodiode of FIG. 1 is operated, a leakage dark current flows at the surface of the mesa structure (i.e., the interfaces of the semiconductor layers 602, 603, 604, 605, 606 and 607 with the passivation film 610) through the above interfacial states. Also, to induce the avalanche breakdown phenomenon in response to incident light irradiated along an arrow A through the passivation film 610, a high electric field is applied to the p$^-$-InGaAs light-absorbing layer 605 due to a reverse bias voltage applied across the n- and p-side electrodes 608 and 609.

The typical strength of the applied electric field is approximately 500 to 600 kV/cm for the InGaAsP/InAlAs carrier multiplication layer 603, and approximately 100 to 200 kV/cm for the InGaAs light-absorbing layer 605.

The leakage dark current flowing at the surface of the mesa structure serves like hot carriers due to the high electric field, and is injected into the passivation film 610 to be stored therein. Due to this phenomenon, the surface of the mesa structure, i.e., the interfaces of the semiconductor layers 602, 603, 604, 605, 606 and 607 with the passivation film 610, deteriorate and at the same time, the surface potential of the mesa structure varies to thereby increase the leakage dark current.

The increase of the surface leakage dark current due to the hot carrier injection is prominent at the interface of the InGaAs light-absorbing layer 605 having a small energy band gap with the passivation film 610. This is a chief cause for the dark current increase with the time.

In addition, the increase rate of the leakage dark current varies strongly dependent upon the injection energy of the hot carriers, in other words, the electric-field strength in the InGaAs light-absorbing layer 605. For example, when the electric-field strength of the light-absorbing layer 605 is 100 kV/cm or less, an obtainable lifetime of the photodiode is $10^5$ to $10^6$ hours. When it is 100 to 150 kV/cm or greater, an obtainable lifetime is $10^4$ hours or less. Consequently, to increase the lifetime of the conventional photodiode of FIG. 1, it is necessary that the electric-field strength of the light-absorbing layer 605 is kept at 100 kV/cm or less.

However, if the thickness and/or doping concentration of the semiconductor layers 602, 603, 604, 605, 606 and 607 are set so that the electric-field strength of the light-absorbing layer 605 is kept at 100 kV/cm or less, the following new problem occurs.

Due to the electric-field strength reduction, the frequency response of the conventional photodiode of FIG. 1 deteriorates at the low bias voltage in which an obtainable carrier multiplication rate is low. As a result, the dynamic range for the high-speed response becomes extremely narrow.

SUMMARY OF THE INVENTION

Accordingly, an object of the present invention is to provide a superlattice avalanche photodiode with a mesa structure that enables to keep its noise characteristic low for a long time without decreasing the dynamic range for high-speed response.

Another object of the present invention is to provide a superlattice avalanche photodiode with a mesa structure that has an increased lifetime.

Still another object of the present invention is to provide a superlattice avalanche photodiode with a mesa structure that has an improved reliability.

These objects together with others not specifically mentioned will become clear to those skilled in the art from the following description.

A superlattice avalanche photodiode with a mesa structure according to the present invention includes a semiconductor substrate of a first conductivity type, a first semiconductor electric-field buffer layer of the first conductivity type formed at the substrate, a semiconductor superlattice carrier multiplication layer formed on the first semiconductor electric-field buffer layer, a second semiconductor electric-field buffer layer of a second conductivity type opposite to the first conductivity type formed on the carrier multiplication layer, and a semiconductor light-absorbing layer of the second conductivity type formed on the second semiconductor electric-field buffer layer.

At least the light-absorbing layer constitutes the mesa structure formed at the substrate.

The first electric-field buffer layer is made of a central part and a peripheral part surrounding the central part. The peripheral part has a greater electric-field relaxation effect than that of the central part.

The photodiode has a first electrode electrically connected to the first semiconductor electric-field buffer layer and a second electrode electrically connected to the semiconductor light-absorbing layer.

With the superlattice avalanche photodiode according to the present invention, since the first electric-field buffer layer is made of a central part having a relatively less electric-field relaxation effect and a peripheral part having a relatively greater electric-field relaxation effect, an electric-field, which is generated in the mesa structure by an applied bias voltage across the first and second electrodes, is more relaxed in the peripheral part than in central part.

Therefore, if the electric-field relaxation effect of the entire first electric-field buffer layer is adaptively controlled, the electric-field strength can be kept at a high value (for example, approximately 150 kV/cm) that enables a wide dynamic range for high-speed response in the central part of the mesa structure, which restrains the surface deterioration of the mesa structure. At the same time, the electric-field strength can be set at a low value (for example, approximately 100 to 50 kV/cm) that enables to reduce the dark-current increase rate in the peripheral part thereof.

As a result, the noise characteristic of the photodiode can be kept low for a long time without decreasing the dynamic range for high-speed response.

Also, since the surface of the mesa structure can be restrained to be damaged, both the lifetime and reliability of the photodiode can be improved.

Preferably, the carrier multiplication layer is of i-type (i.e., undoped), or of high resistance (i.e., low carrier concentration). The term "high resistance" means that the resistivity is $10^3$ $\Omega$.cm or less. The term "low carrier concentration" means that the carrier concentration is $4\times10^{16}$ atoms/cm$^3$ or less. If the resistivity is greater than $10^3$ $\Omega$.cm, or the carrier concentration is greater than $4\times10^{16}$ atoms/cm$^3$, there arises a possibility that a satisfactory carrier multiplication effect cannot be obtained.

In a preferred embodiment, the central part of the first electric-field buffer layer has a thickness greater than that of the peripheral part. The relatively thicker central part has a relatively less electric-field relaxation effect and the relatively thin peripheral part has a relatively greater electric-field relaxation effect.

In this case, the central part of the first electric-field buffer layer preferably has a thickness that can prevent an electric field generated in the carrier multiplication layer from penetrating the central part, and the peripheral part thereof has a thickness that allows the electric field to penetrate the peripheral part.

The thickness of the peripheral part needs to be equal to 95% or less of the thickness of the central part. If the thickness of the peripheral part is less than 95% of the thickness of the central part, no sufficient difference of the electric-field relaxation effect is obtained.

In another preferred embodiment, an electric-field buffer region is selectively formed in a central part of the mesa structure. In the peripheral part of the mesa structure, the electric field is relaxed by only the first electric-field buffer layer. On the other hand, in the central part of the mesa structure, the electric field is relaxed by the first electric-field buffer layer and the electric-field buffer region.

The electric-field buffer region is preferably formed in a semiconductor barrier layer of the first conductivity type, which is formed at the substrate to be contacted with the first electric-field buffer layer.

The semiconductor barrier layer may be formed inside or outside the mesa structure.

In still another preferred embodiment, a high electric-resistance region is selectively formed in a peripheral part of the mesa structure. Since the high electric-resistance region is formed in the peripheral part of the mesa structure, the electric field in the peripheral part is more relaxed than the central part.

The high electric-resistance region is preferably formed in the first electric-field buffer layer and/or a semiconductor barrier layer of the first conductivity type. The barrier layer is formed at the substrate to be contacted with the first electric-field buffer layer.

In a further preferred embodiment, an interfacial-state reducing region is selectively formed to cover a side face of the mesa structure. Since interfacial states existing at the interface of the mesa structure are reduced by the interfacial-state reducing region, the initial value of the dark current can be decreased.

Accordingly, there is an additional advantage that the deterioration of the photodiode can be further restrained.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

FIRST EMBODIMENT

Figure 2A:
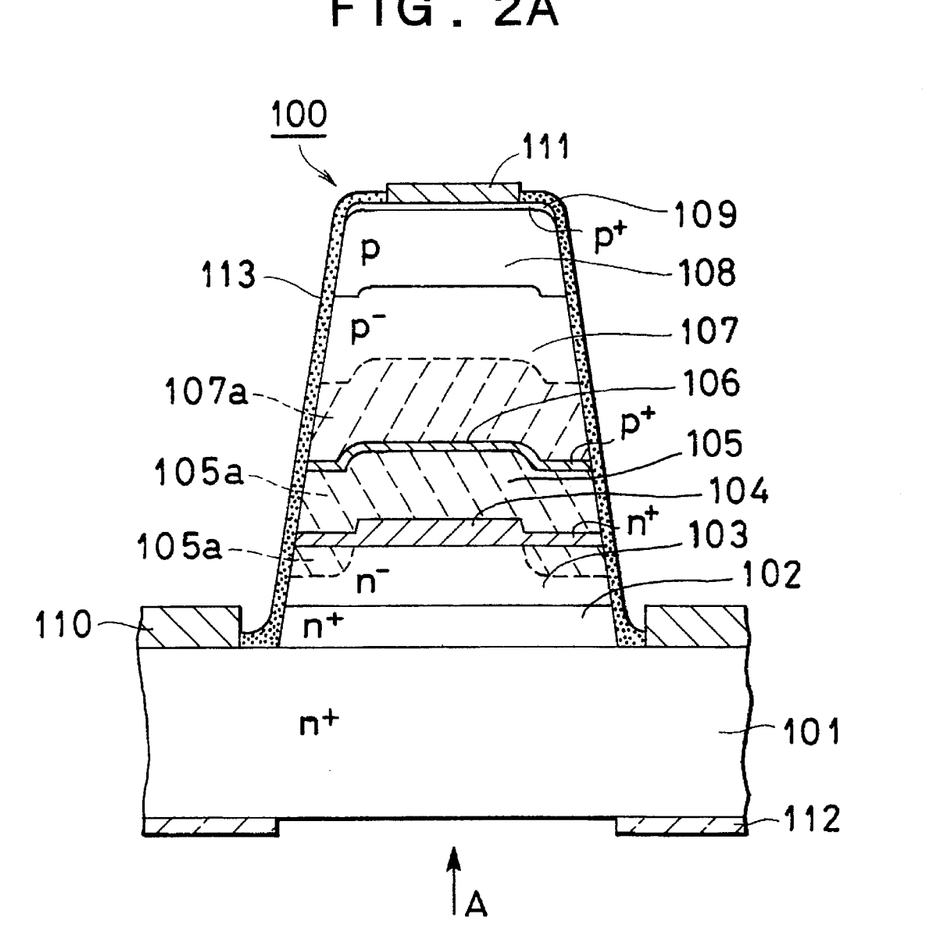
FIG. 2A is a partial cross-sectional view of a superlattice avalanche photodiode according to a first embodiment of the invention.
Figure 2B:
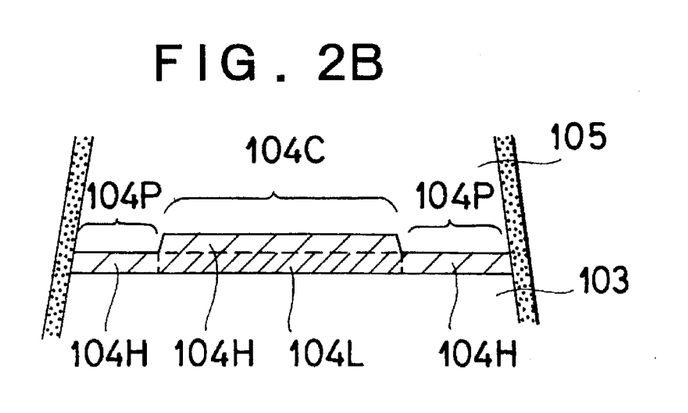
FIG. 2B is an enlarged, partial cross-sectional view of the superlattice avalanche photodiode according to the first embodiment, which shows the detailed structure of the n$^+$-InP electric-field buffer layer.

A superlattice avalanche photodiode 100 according to a first embodiment is shown in FIGS. 2A and 2B, which is fabricated by the following process sequence.

First, an n$^+$-InP buffer layer 102 is formed on an n$^+$-InP substrate 101. The layer 102 has a thickness of 0.2 µm and a carrier concentration of $5\times10^{17}$ atoms/cm$^3$ or more. An n$^-$-InP buffer layer 103 is then formed on the n$^+$-InP buffer layer 102. The layer 103 has a thickness of 0.2 µm and a carrier concentration of $1\times10^{16}$ atoms/cm$^3$.

A lower part 104L of an n$^+$-InP electric-field buffer layer 104 is formed on the n$^-$-InP buffer layer 103. The lower part 104L has a thickness of 0.1 µm and a carrier concentration of $2\times10^{18}$ atoms/cm$^3$. The layers 102 and 103 and the lower part 104L of the layer 104 are epitaxially grown by gas-source molecular beam epitaxy (MBE).

Next, using popular photolithography and etching techniques, the lower part 104L of the n$^+$-InP electric-field buffer layer 104 is selectively removed to thereby remain its circular central region having a diameter of 20 μm. At this stage, the surface of the n⁻-InP buffer layer 103 is exposed from the lower part 104L.

Then, to remove a carbon and/or an oxide generated on the remaining central region of the part 104L, the substrate 101 is processed using ammonium sulfide, a hydrogen radical beam, or a group V gaseous material having an amino group and an etching action.

Subsequently, the following semiconductor layers are successively and epitaxially grown by gas-source MBE. Specifically, an upper part 104H of the n⁺-InP electric-field buffer layer 104 is formed on the remaining lower part 104L and on the exposed n⁺-InP buffer layer 103. The upper part 104H covers the lower part 104L and the layer 103. The upper part 104H has a thickness of 0.02 μm and a carrier concentration of $1\times10^{18}$ atoms/cm³.

Thus, as shown in FIG. 2B, the resultant central part 104C of the n⁺-InP electric-field buffer layer 104 is made of the stacked lower and upper parts 104L and 104H, and has a thickness of approximately 0.12 μm. Also, the resultant peripheral part 104P thereof is made of the upper part 104H alone, and has a thickness of approximately 0.02 μm. Therefore, the thickness of the peripheral part 104P is equal to approximately 17% of that of the central part 104C.

An undoped (i.e., i-type) InAlGaAs/InAlAs superlattice carrier multiplication layer 105 is formed on the upper part 104H of the n⁺-InP electric-field buffer layer 104. The layer 105 is lattice-matched with InP, and has a thickness of 0.23 μm and a carrier concentration of $1\times10^{15}$ atoms/cm³ or les A p⁺-InP electric-field buffer layer 106 is formed on the undoped InAlGaAs/InAlAs superlattice carrier multiplication layer 105. The layer 106 has a thickness of 0.05 μm and a carrier concentration of $7\times10^{17}$ atoms/cm³.

A p⁻-InGaAs light-absorbing layer 107 is formed on the p⁺-InP electric-field buffer layer 106. The layer 107 has a thickness of 1 μm and a carrier concentration of $1\times10^{15}$ atoms/cm³.

A p-InP cap layer 108 is formed on the p⁻-InGaAs light-absorbing layer 107. The layer 108 has a thickness of 0.5 μm and a carrier concentration of $5\times10^{15}$ atoms/cm³.

A p⁺-InGaAs contact layer 109 is formed on the p-InP cap layer 108. The layer 109 has a thickness of 0.1 μm and a carrier concentration of $1\times10^{19}$ atoms/cm³.

The stacked semiconductor layers 102, 103, 104, 105, 106, 107, 108 and 109 are selectively removed by using popular photolithography and etching techniques until the surface of the substrate 101 is exposed, thereby forming a tapered mesa structure made of the layers 102, 103, 104, 105, 106, 107, 108 and 109. The mesa structure has an approximately cylindrical shape, which is concentric with the circular central part 104C of the n⁺-InP electric-field buffer layer 104. The peripheral part 104P of the layer 104, the plan shape of which is like a circular ring, has an outer diameter of 30 μm and an inner diameter of 20 μm.

Following the mesa formation process, an SiN passivation film 113 is formed to cover the exposed surfaces of the substrate 101 and the mesa structure. The film 113 is then selectively removed to expose electrode-formation areas on the surfaces of the substrate 101 and the contact layer 109.

An AuZn p-side electrode 111 is selectively formed on the exposed electrode-formation area of the p⁺-InGaAs contact layer 109 to be in ohmic contact therewith. An AuGeNi n-side electrode 110 is selectively formed on the exposed electrode-formation area of the n⁺-InP substrate 101 to be in ohmic contact therewith.

Finally, after polishing the back surface of the substrate 101, an SiN antireflection film 112 having a window is formed on the polished back surface. Thus, the superlattice avalanche photodiode 100 according to the first embodiment is finished.

Incident light enters the photodiode 100 from the back surface of the substrate 101 through the window of the film 112 along an arrow A.

With the photodiode 100 according to the first embodiment, when a reverse bias voltage is applied across the p- and n-side electrodes 111 and 110, depletion regions 105a and 107a are generated, as schematically shown in FIG. 2A.

The depletion region 107a extends upward from the interface of the i-InAlGaAs/InAlAs superlattice carrier multiplication layer 105 and the p⁺-InP electric-field buffer layer 106 into the p⁻-InGaAs light-absorbing layer 107 through the layer 106, because the layer 106 is thin enough for allowing the depletion region 107a to pass therethrough. The layer 107 is sufficiently thick and therefore, the depletion region 107a does not penetrate the layer 107. The region 107a has substantially the same thickness over the entire layer 106.

The depletion region 105a extends downward from the interface of the i-InAlGaAs/InAlAs superlattice carrier multiplication layer 105 and the p⁺-InP electric-field buffer layer 106. The region 105a penetrates the peripheral part 104P of the n⁺-InP electric-field buffer layer 104 to reach the n⁻-InP buffer layer 103, because the part 104P has a small thickness of 0.02 μm.

On the other hand, since the part 104C of the n⁺-InP electric-field buffer layer 104 has a sufficiently large thickness of about 0.12 μm, the region 105a does not penetrate the central part 104C, in other words, it is stopped by the part 104C. Accordingly, the depletion region 105a exists only in the peripheral area of the mesa structure within the n⁻-InP buffer layer 103.

Figure 3A:
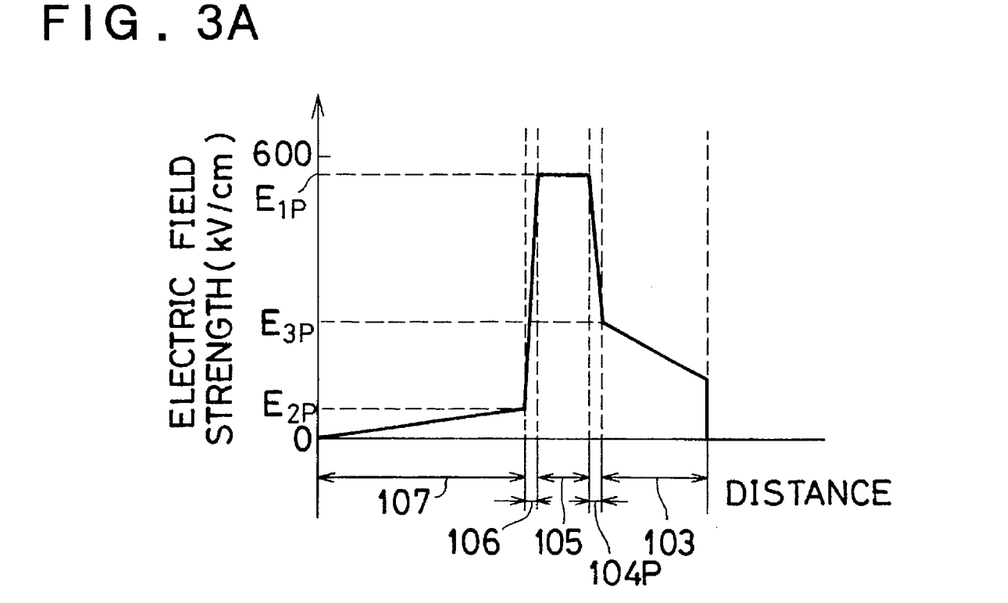
FIG. 3A is a diagram showing the relationship of the electric-field strength of the superlattice avalanche photodiode according to the first embodiment with the distance in the peripheral part of the n$^+$-InP electric-field buffer layer.
Figure 3B:
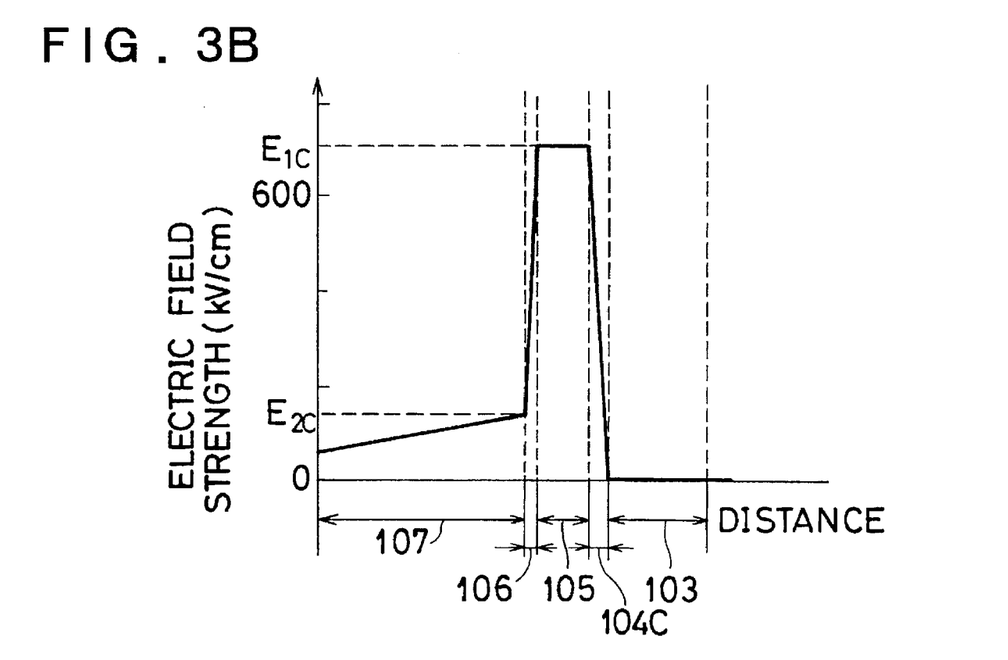
FIG. 3B is a diagram showing the relationship of the electric-field strength of the superlattice avalanche photodiode according to the first embodiment with the distance in the central part of the n$^+$-InP electric-field buffer layer.

FIGS. 3A and 3B show the change of the electric-field strength in the mesa structure as a function of distance under a reverse bias voltage near the breakdown voltage of the multiplication layer 105.

In the peripheral part of the mesa structure, because of the depletion region 105a existing only in the peripheral area of the mesa structure within the n⁻-InP buffer layer 103, the electric-field is highly relaxed compared with that in the central part of the mesa structure.

Specifically, as shown in FIG. 3A, the electric-field strength of the carrier multiplication layer 105 is $E_{1P}$ (slightly less than 600 kV/cm), and is reduced to $E_{2P}$ (near 50 kV/cm) by p⁺-InP electric-field buffer layer 106. Also, it is reduced to $E_{3P}$ (near 250 kV/cm) by the peripheral part 104P of the n⁺-InP electric-field buffer layer 104. Therefore, the electric-field strength is kept near 50 kV/cm or less within the p⁻-InGaAs light-absorbing layer 107.

On the other hand, as shown in FIG. 3B, the electric-field strength of the carrier multiplication layer 105 is $E_{1C}$ (near 700 kV/cm), and is reduced to $E_{2C}$ (near 150 kV/cm) by p⁺-InP electric-field buffer layer 106. Also, it is reduced to zero (0 kV/cm) by the central part 104C of the n⁺-InP electric-field buffer layer 104. Therefore, the electric-field strength is kept near 150 kV/cm or less within the p⁻-InGaAs light-absorbing layer 107.

Thus, the electric-field strength can be kept at a high value of approximately 150 kV/cm that enables a wide dynamic range for high-speed response in the central part of the mesa structure. This restrains the surface deterioration of the mesa structure. At the same time, the electric-field strength can be set at a low value of approximately 50 kV/cm that enables to reduce the dark-current increase rate in the peripheral part thereof.

As a result, the noise characteristic of the photodiode 100 according to the first embodiment can be kept low for a long time without decreasing the dynamic range for high-speed response.

Also, since the surface of the mesa structure can be restrained to be damaged, both the lifetime and reliability of the photodiode can be improved.

The inventor fabricated the photodiode 100 according to the first embodiment and the conventional photodiode 600 shown in FIG. 1, and performed tests about high-speed response, dark current characteristic and reliability. Consequently, the following results were obtained.

Both of the photodiodes 100 and 600 exhibited substantially the same performance for high-speed response. The GB product value of approximately 120 GHz was obtained for both the photodiodes 100 and 600.

For the dark current characteristic, both of the photodiodes 100 and 600 exhibited an approximately the same initial value, in which both of the photodiodes 100 and 600 had the same diameter of the mesa structure.

The reliability test was performed under the condition that the ambient temperature was 200° C., the injected reverse current was 100 µA, and the operating time was continuously 1000 hours. The test results stated that approximately no dark current increase was observed for the photodiode 100 according to the first embodiment, while a dark current increase was observed for the conventional photodiode 600.

SECOND EMBODIMENT

Figure 4:
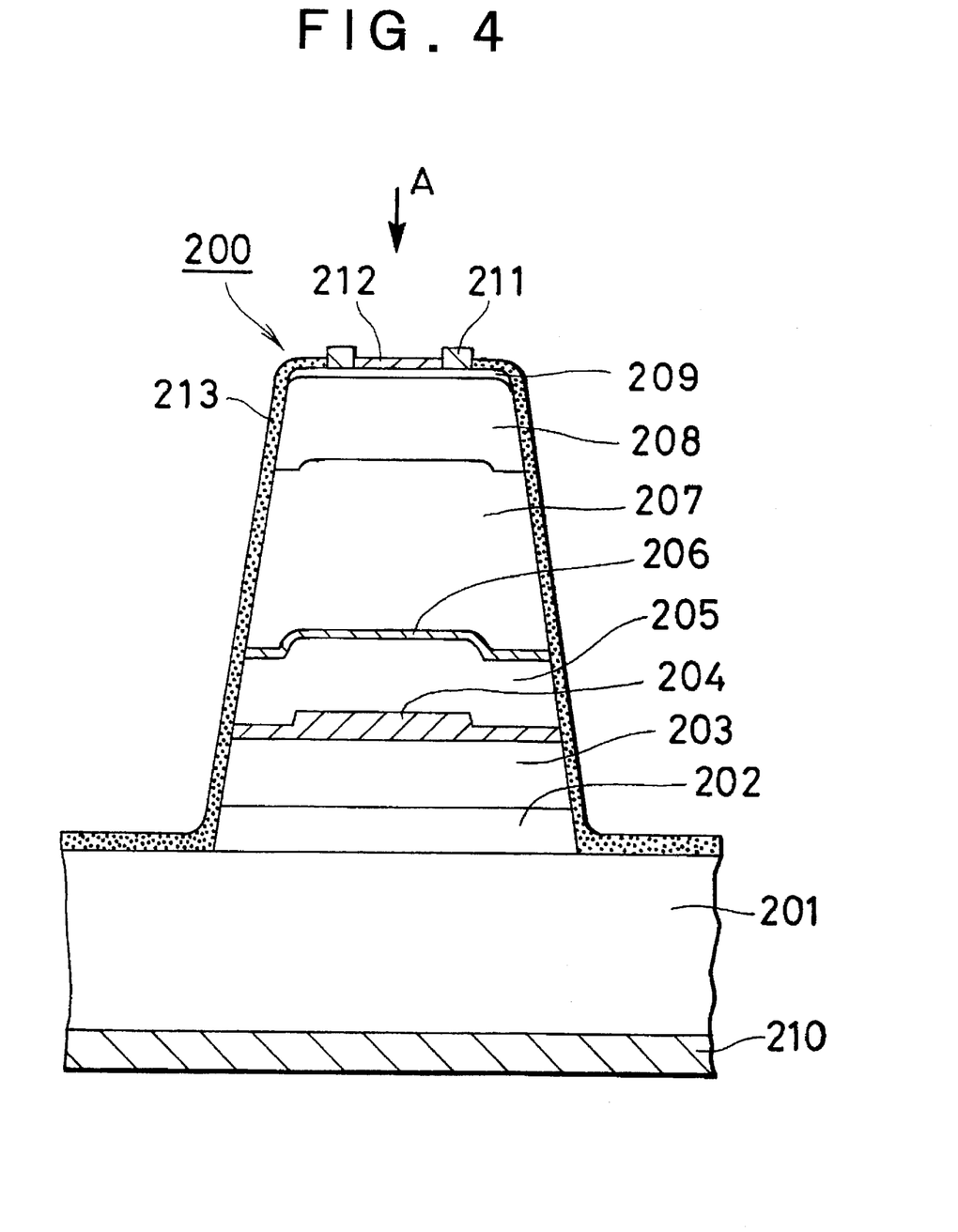
FIG. 4 is a partial cross-sectional view of a superlattice avalanche photodiode according to a second embodiment of the invention.

A superlattice avalanche photodiode 200 according to a second embodiment is shown in FIG. 4, which is fabricated by the following process sequence.

Incident light is entered the above photodiode 100 in the first embodiment through the back surface of the substrate 100. However, in the photodiode 200 according to the second embodiment, the incident light enters through the top of the mesa structure through along an arrow A.

The photodiode 200 is fabricated by gas-source MBE as follows.

First, an $n^+$-InP buffer layer 202, an $n^-$-InP buffer layer 203, an $n^+$-InP electric-field buffer layer 204, an i-InAlGaAs/InAlAs superlattice carrier multiplication layer 205, a $p^+$-InP electric-field buffer layer 206, a $p^-$-InGaAs light-absorbing layer 207, a p-InP cap layer 208, and a $p^+$-InGaAs contact layer 209 are successively formed on an $n^+$-InP substrate 201. The thickness and carrier concentration of these layers 202, 203, 204, 205, 206, 207, 208 and 209 are the same as those of the first embodiment.

Then, in the same way as that of the first embodiment, the stacked semiconductor layers 202, 203, 204, 205, 206, 207, 208 and 209 are selectively removed by using popular photolithography and etching techniques until the surface of the substrate 201 is exposed, thereby forming a tapered mesa structure made of the layers 202, 203, 204, 205, 206, 207, 208 and 209. The mesa structure has the same shape as that of the first embodiment.

Following the mesa formation process, an SiN passivation film 213 is formed to cover the exposed surfaces of the substrate 201 and the mesa structure. The film 213 is then selectively removed to expose an electrode-formation area on the contact layer 209.

An AuZn p-side electrode 211 with a shape of a circular ring is formed on the exposed electrode-formation area of the $p^+$-InGaAs contact layer 209 to be in ohmic contact therewith.

An SiN antireflection film 212 is selectively formed on the exposed $p^+$-InGaAs contact layer 209 through an window of the electrode 211.

Finally, an AuGeNi n-side electrode 210 is formed on the back surface of the $n^+$-InP substrate 201 to be in ohmic contact therewith. Thus, the superlattice avalanche photodiode 200 according to the second embodiment is finished.

With the photodiode 200 according to the second embodiment, since the mesa structure is the same as that of the first embodiment, the same effects of advantages can be obtained as those of the first embodiment.

According to the inventor's tests, it was confirmed that the same results were obtained as those of the first embodiment.

THIRD EMBODIMENT

Figure 5:
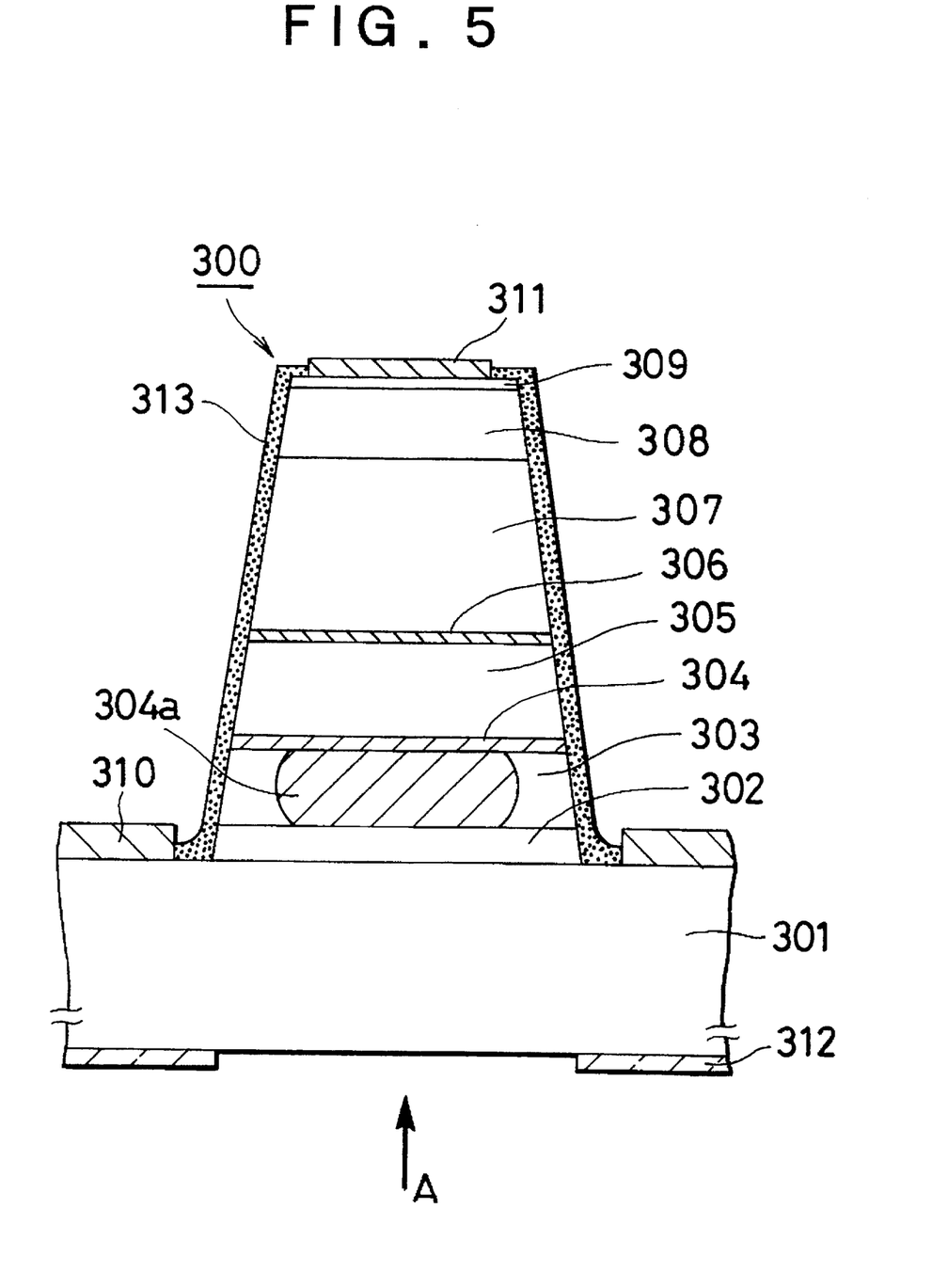
FIG. 5 is a partial cross-sectional view of a superlattice avalanche photodiode according to a third embodiment of the invention.

A superlattice avalanche photodiode 300 according to a third embodiment is shown in FIG. 5, which is fabricated by the following process sequence.

First, an $n^+$-InP buffer layer 302 is formed on an $n^+$-InP substrate 301. The layer 302 has a thickness of 0.2 µm and a carrier concentration of $5 \times 10^{17}$ atoms/cm$^3$ or more. An $n^-$-InP buffer layer 303 is then formed on the $n^+$-InP buffer layer 302. The layer 303 has a thickness of 0.2 µm and a carrier concentration of $1 \times 10^{16}$ atoms/cm$^3$. These process steps are the same as those in the first embodiment.

Next, using popular photolithography and ion-implantation (or thermal diffusion) techniques, silicon (Si) is selectively doped into the $n^-$-InP buffer layer 303 to form an $n^+$-InP electric-field relaxing region 304a therein. The region 304a has a circular plan shape whose diameter is 20 µm and a depth of 0.2 µm. At this stage, the bottom of the region 304a is contacted with the buffer layer 302. The doping concentration of the region 304a is $1 \times 10^{18}$ atoms/cm$^3$ or more.

Then, to remove a carbon and/or an oxide generated on the region 304a, the substrate 301 is processed using ammonium sulfide, a hydrogen radical beam, or a group V gaseous material having an amino group and an etching action.

Subsequently, the following semiconductor layers are successively and epitaxially grown by gas-source MBE. Specifically, an $n^+$-InP electric-field buffer layer 304 is formed on the $n^-$-InP buffer layer 303 to cover the $n^+$-InP electric-field relaxing region 304a. The layer 304 has a thickness of 0.02 µm and a carrier concentration of $1 \times 10^{18}$ atoms/cm$^3$.

Unlike the first embodiment, the $n^+$-InP electric-field buffer layer 304 is flat and has no thickness difference.

Then, an i-InAlGaAs/InAlAs superlattice carrier multiplication layer 305 is formed on the $n^+$-InP electric-field buffer layer 304. The layer 305 is lattice-matched with InP, and has a thickness of 0.23 µm and a carrier concentration of $1 \times 10^{15}$ atoms/cm$^3$ or less.

A $p^+$-InP electric-field buffer layer 306 is formed on the i-InAlGaAs/InAlAs superlattice carrier multiplication layer 305. The layer 306 has a thickness of 0.05 µm and a carrier concentration of $7 \times 10^{17}$ atoms/cm$^3$.

A $p^-$-InGaAs light-absorbing layer 307 is formed on the $p^+$-InP electric-field buffer layer 306. The layer 307 has a thickness of 1 µm and a carrier concentration of $1 \times 10^{15}$ atoms/cm$^3$.

A p-InP cap layer 308 is formed on the $p^-$-InGaAs light-absorbing layer 307. The layer 308 has a thickness of 0.5 µm and a carrier concentration of $5 \times 10^{15}$ atoms/cm$^5$.

A p+-InGaAs contact layer 309 is formed on the p-InP cap layer 308. The layer 309 has a thickness of 0.1 μm and a carrier concentration of $1\times10^{19}$ atoms/cm$^3$.

The stacked semiconductor layers 302, 303, 304, 305, 306, 307, 308 and 309 are selectively removed by using popular photolithography and etching techniques until the surface of the substrate 301 is exposed, thereby forming a tapered mesa structure made of the layers 302, 303, 304, 305, 306, 307, 308 and 309. The mesa structure has an approximately cylindrical shape whose diameter is 30 μm at the n+-InP electric-field buffer layer 304, which is concentric with the circular n+-InP electric-field buffer region 304a whose diameter is 20 μm.

Following the mesa formation process, an SiN passivation film 313 is formed to cover the exposed surfaces of the substrate 301 and the mesa structure. The film 313 is then selectively removed to expose electrode-formation areas on the surfaces of the substrate 301 and the contact layer 309.

An AuZn p-side electrode 311 is selectively formed on the exposed electrode-formation area of the p+-InGaAs contact layer 309 to be in ohmic contact therewith. An AuGeNi n-side electrode 310 is selectively formed on the exposed electrode-formation area of the n+-InP substrate 301 to be in ohmic contact therewith.

Finally, after polishing the back surface of the substrate 301, an SiN antireflection film 312 having a window is formed on the polished back surface. Thus, the superlattice avalanche photodiode 300 according to the third embodiment is finished.

Incident light enters the photodiode 300 from the back surface of the substrate 301 through the window of the film 312 along an arrow A.

With the photodiode 300 according to the third embodiment, since the circular n+-InP electric-field buffer region 304a is formed in the central part of the mesa structure, the electric-field strength is highly relaxed by both of the n+-InP electric-field buffer layer 304 and region 304a in the peripheral part of the mesa structure. On the other hand, in the central part of the mesa structure, the electric-field strength is relaxed by the n+-InP electric-field buffer layer 304 alone.

Accordingly, the electric-field relaxation effect in the peripheral part of the mesa structure is greater than that of the central part thereof. As a result, the same effects of advantages can be obtained as those of the first embodiment.

According to the inventor's tests, it was confirmed that the same results as those of the first embodiment were obtained.

FOURTH EMBODIMENT

Figure 6:
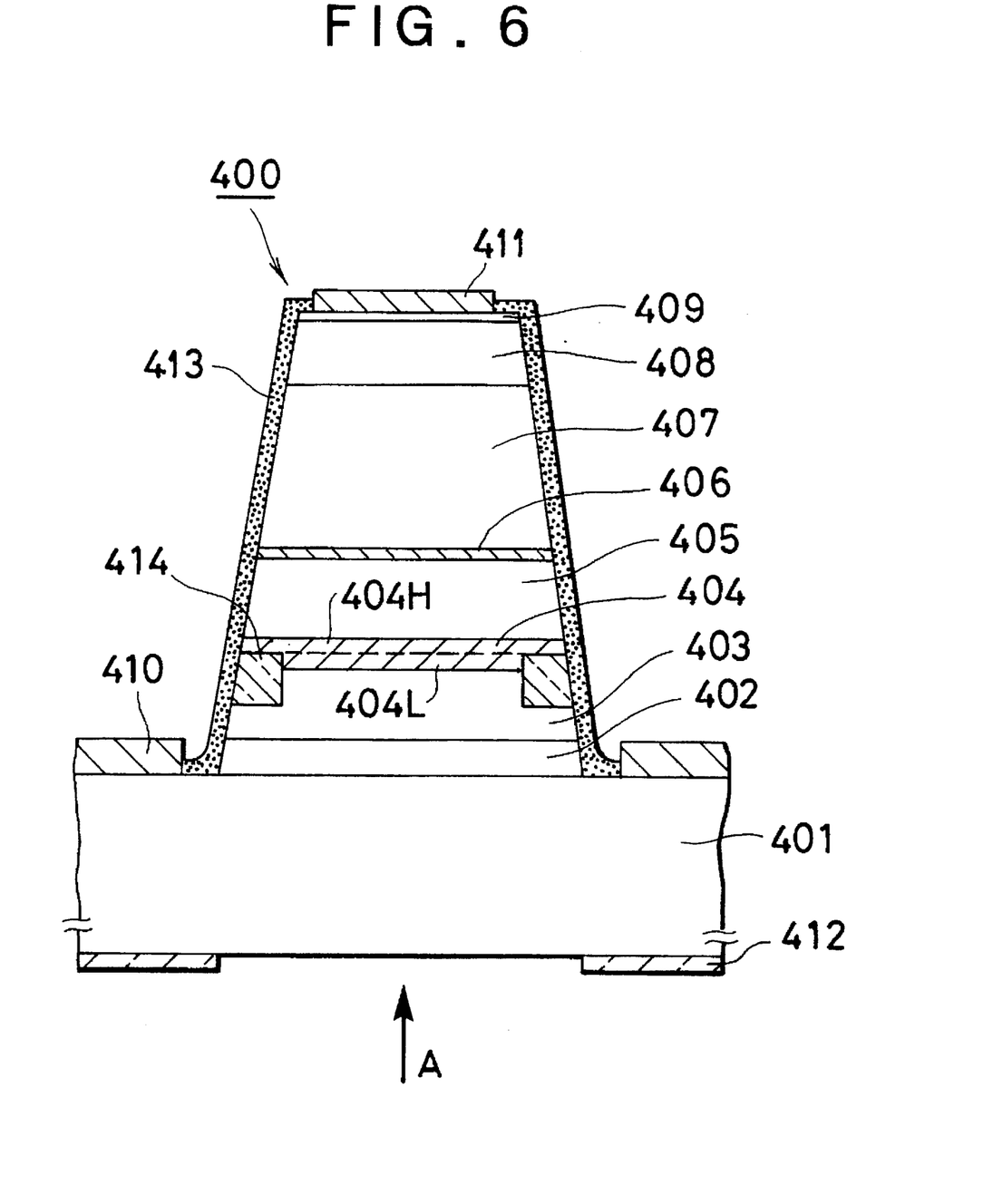
FIG. 6 is a partial cross-sectional view of a superlattice avalanche photodiode according to a fourth embodiment of the invention.

A superlattice avalanche photodiode 400 according to a fourth embodiment is shown in FIG. 6, which is fabricated by the following process sequence.

First, an n+-InP buffer layer 402 is formed on an n+-InP substrate 401. The layer 402 has a thickness of 0.2 μm and a carrier concentration of $5\times10^{17}$ atoms/cm$^3$ or more. An n−-InP buffer layer 403 is then formed on the n+-InP buffer layer 402. The layer 403 has a thickness of 0.2 μm and a carrier concentration of $1\times10^{16}$ atoms/cm$^3$.

Next, a lower part 404L of an n+-InP electric-field buffer layer 404 is formed on the n$^{31}$-InP buffer layer 403. The lower part 404L has a thickness of 0.1 μm and a carrier concentration of $2\times10^{18}$ atoms/cm$^3$.

The above process steps are the same as those in the first embodiment.

Next, using popular photolitography and ion-implantation (or thermal diffusion) techniques, iron (Fe) or cobalt (Co) is selectively doped into the n−-InP buffer layer 403 and the lower part 404L to form a high-resistance region 414 therein. The region 414 has a plan shape of a circular ring whose inner diameter is 20 μm and a depth of 0.2 μm. At this stage, the top of the region 414 is in accordance with the surfaces of the layer 403 and the part 404L. The doping concentration of the region 504a is greater than $2\times10^{18}$ atoms/cm which is equal to that of the lower part 404L, providing a high electric resistance.

Then, to remove a carbon and/or an oxide generated on the region 414 and the part 404L, the substrate 401 is processed in the same way as that of the first embodiment.

Subsequently, the following semiconductor layers are successively and epitaxially grown by gas-source MBE. Specifically, an upper part 404H of the n+-InP electric-field buffer layer 404 is formed on the high-resistance region 414 and the lower part 404L. The upper part 404H has a thickness of 0.02 μm and a carrier concentration of $1\times10^{18}$ atoms/cm$^3$.

Unlike the first embodiment, the n+-InP electric-field buffer layer 404 is flat except for the high-resistance region 414. However, the central part of the layer 404 is made of the lower and upper parts 404L and 404H, and the peripheral part thereof is made of the upper part 404H alone. Therefore, the layer 404 has substantially the same thickness difference similar to the first embodiment.

Then, an i-InAlGaAs/InAlAs superlattice carrier multiplication layer 405 is formed on the n+-InP electric-field buffer layer 404. The layer 405 is lattice-matched with InP, and has a thickness of 0.23 μm and a carrier concentration of $1\times10^{15}$ atoms/cm$^3$ or less.

A p+-InP electric-field buffer layer 406 is formed on the i-InAlGaAs/InAlAs superlattice carrier multiplication layer 405. The layer 406 has a thickness of 0.05 μm and a carrier concentration of $7\times10^{17}$ atoms/cm$^3$.

A p−-InGaAs light-absorbing layer 407 is formed on the p+-InP electric-field buffer layer 406. The layer 407 has a thickness of 1 μm and a carrier concentration of $1\times10^{15}$ atoms/cm$^3$.

A p-InP cap layer 408 is formed on the p−-InGaAs light-absorbing layer 407. The layer 408 has a thickness of 0.5 μm and a carrier concentration of $5\times10^{15}$ atoms/cm$^3$.

A p+-InGaAs contact layer 409 is formed on the p-InP cap layer 408. The layer 409 has a thickness of 0.1 μm and a carrier concentration of $1\times10^{19}$ atoms/cm$^3$.

The stacked semiconductor layers 402, 403, 404, 405, 406, 407, 408 and 409 are selectively removed by using popular photolithography and etching techniques until the surface of the substrate 401 is exposed, thereby forming a tapered mesa structure made of the layers 402, 403, 404, 405, 406, 407, 408 and 409. The mesa structure has an approximately cylindrical shape whose diameter is 30 μm at the n+-InP electric-field buffer layer 404, which is concentric with the circular-ringed high-resistance region 414 whose inner diameter is 20 μm.

Following the mesa formation process, an SiN passivation film 413 is formed to cover the exposed surfaces of the substrate 401 and the mesa structure. The film 413 is then selectively removed to expose electrode-formation areas on the surfaces of the substrate 401 and the contact layer 409.

An AuZn p-side electrode 411 is selectively formed on the exposed electrode-formation area of the p+-InGaAs contact layer 409 to be in ohmic contact therewith. An AuGeNi n-side electrode 410 is selectively formed on the exposed electrode-formation area of the n+-InP substrate 401 to be in ohmic contact therewith.

Finally, after polishing the back surface of the substrate 401, an SiN antireflection film 412 having a window is formed on the polished back surface. Thus, the superlattice avalanche photodiode 400 according to the fourth embodiment is finished.

Incident light enters the photodiode 400 from the back surface of the substrate 401 through the window of the film 412 along an arrow A.

With the photodiode 400 according to the fourth embodiment, since the high-resistance region 414 is formed in the peripheral part of the mesa structure, similar to the first embodiment, the electric-field relaxation effect is highly reduced in the peripheral part of the of the mesa structure compared with the central part thereof. Therefore, the same effects of advantages can be obtained as those of the first embodiment.

According to the inventor's tests, it was confirmed that the same results were obtained as those of the first embodiment.

FIFTH EMBODIMENT

Figure 7:
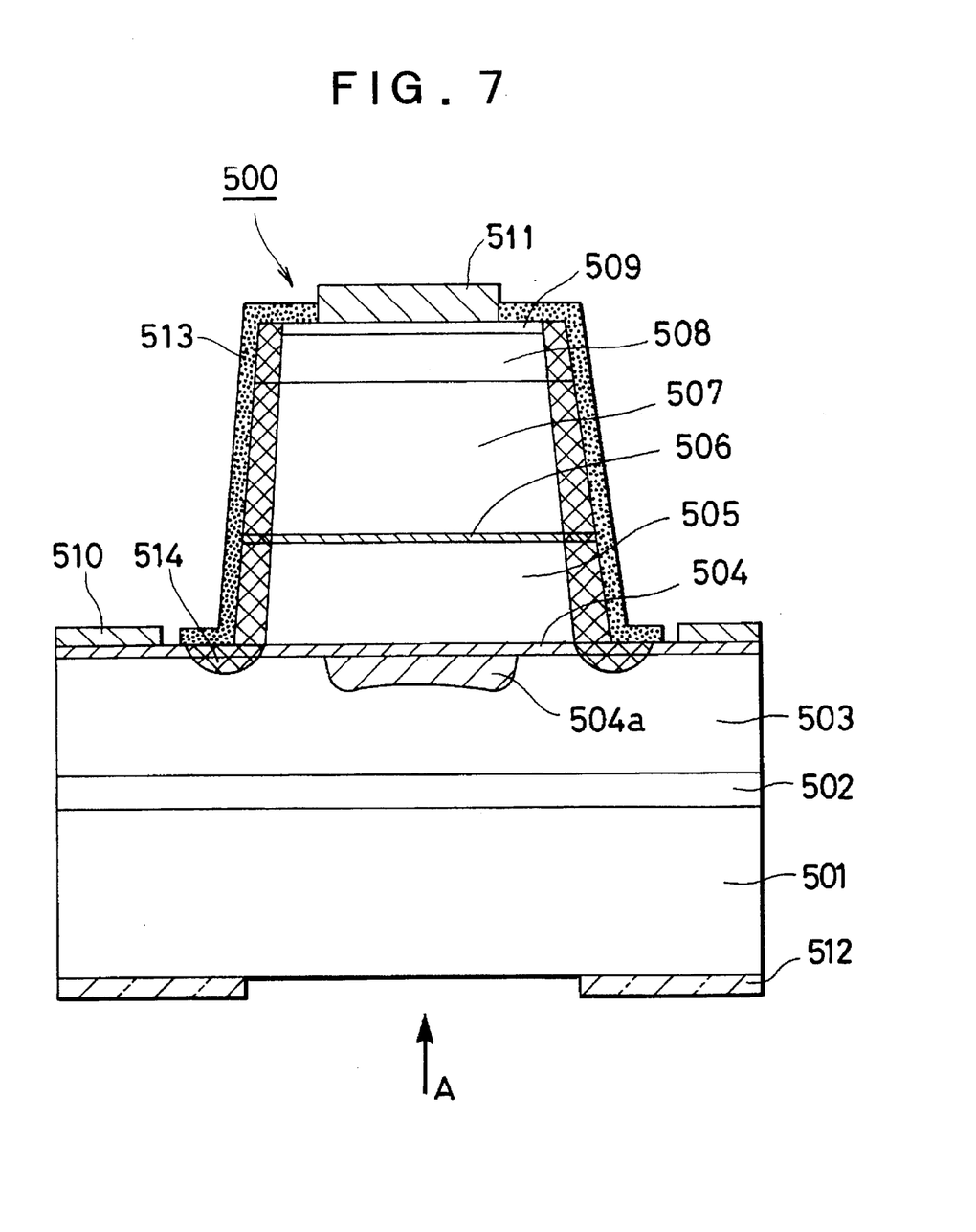
FIG. 7 is a partial cross-sectional view of a superlattice avalanche photodiode according to a fifth embodiment of the invention.

A superlattice avalanche photodiode 500 according to a fifth embodiment is shown in FIG. 7, which is fabricated by the following process sequence.

First, an $n^+$-InP buffer layer 502 is formed on an $n^+$-InP substrate 501. The layer 502 has a thickness of 0.2 μm and a carrier concentration of $5 \times 10^{17}$ atoms/cm$^3$ or more. An $n^-$-InP buffer layer 503 is then formed on the $n^+$-InP buffer layer 502. The layer 503 has a thickness of 1.2 μm greater than those of the first to fourth embodiments and a carrier concentration of $1 \times 10^{16}$ atoms/cm$^3$.

Next, using popular photolithography and ion-implantation (or thermal diffusion) techniques, Si is selectively doped into the $n^-$-InP buffer layer 503 to form an $n^+$-InP electric-field buffer region 504a therein. The region 504 has a circular plan shape whose diameter is 20 μm and a depth of 0.2 μm. At this stage, the top of the region 504a is in accordance with the surface of the layer 503. The doping concentration of the region 504a is greater than $2 \times 10^{18}$ atoms/cm which is equal to that of the lower part 404L.

Then, to remove a carbon and/or an oxide generated on the region 504a and the layer 503, the substrate 501 is processed in the same way as that of the first embodiment.

Subsequently, the following semiconductor layers are successively and epitaxially grown by gas-source MBE. Specifically, an $n^+$-InP electric-field buffer layer 504 is formed on the $n^-$-InP buffer layer 503 to cover the $n^+$-InP electric-field buffer region 504a. The layer 504 has a thickness of 0.02 μm and a carrier concentration of $1 \times 10^{18}$ atoms/cm$^3$.

Unlike the first embodiment, the $n^+$-InP electric-field buffer layer 504 is flat.

Then, an i-InAlGaAs/InAlAs superlattice carrier multiplication layer 505 is formed on the $n^+$-InP electric-field buffer layer 504. The layer 505 is lattice-matched with InP, and has a thickness of 0.23 μm and a carrier concentration of $1 \times 10^{15}$ atoms/cm$^3$ or less.

A $p^+$-InP electric-field buffer layer 506 is formed on the i-InAlGaAs/InAlAs superlattice carrier multiplication layer 505. The layer 506 has a thickness of 0.05 μm and a carrier concentration of $7 \times 10^{17}$ atoms/cm$^3$.

A $p^-$-InGaAs light-absorbing layer 507 is formed on the $p^+$-InP electric-field buffer layer 506. The layer 507 has a thickness of 1 μm and a carrier concentration of $1 \times 10^{15}$ atoms/cm$^3$. atoms/cm$^3$.

A p-InP cap layer 508 is formed on the $p^-$-InGaAs light-absorbing layer 507. The layer 508 has a thickness of 0.5 μm and a carrier concentration of $5 \times 10^{15}$ atoms/cm$^3$.

A $p^+$-InGaAs contact layer 509 is formed on the p-InP cap layer 508. The layer 509 has a thickness of 0.1 μm and a carrier concentration of $1 \times 10^{19}$ atoms/cm$^3$.

Subsequently, prior to the mesa formation process, an SiO$_2$ film is deposited on the entire exposed surface of the semiconductor layers to be patterned by popular photolithography and etching techniques, thereby forming a masking film (not shown). The SiO$_2$ masking film has a circular-ringed window which is concentric with the circular region 504a. The inner diameter of the window is 26 μm.

Using the SiO$_2$ masking film, zinc (Zn) is selectively doped into the stacked semiconductor layers 505, 506, 507, 508 and 509 by a thermal diffusion technique, thereby forming a $p^+$-diffusion region 514 therein. The bottom of the region 514 reaches the $n^-$-InP buffer layer 503 through the layers 509, 508, 507, 506, 505 and 504. The bottom of the region 514 is disposed at a position where the depth from the surface of the layer 503 is 0.2 μm. The masking film is then removed.

As shown in FIG. 7, the $p^+$-diffusion region 514 surrounds the entire side face of the mesa structure, the thickness of which is approximately 0.2 μm.

Using popular photolithography and wet etching techniques, the stacked semiconductor layers 505, 506, 507, 508 and 509 are selectively removed until the surface of the $n^+$-InP electric-field buffer layer 504 is exposed, thereby forming a tapered mesa structure made of the layers 505, 506, 507, 508 and 509. The mesa structure has an approximately cylindrical shape whose diameter is 30 μm at the $n^+$-InP electric-field buffer layer 504, which is concentric with the circular-ringed $p^-$-diffusion region 504a whose diameter is 20 μm.

Following the mesa formation process, an SiN passivation film 513 is formed to cover the exposed surfaces of the $n^+$-InP electric-field buffer layer 504 and the mesa structure. The film 513 is then selectively removed to expose electrode-formation areas on the surfaces of the layer 504 and the contact layer 509.

An AuZn p-side electrode 511 is selectively formed on the exposed electrode-formation area of the $p^+$-InGaAs contact layer 509 to be in ohmic contact therewith. An AuGeNi n-side electrode 510 is selectively formed on the exposed electrode-formation area of the electric-field buffer layer 504 to be in ohmic contact therewith.

Finally, after polishing the back surface of the substrate 501, an SiN antireflection film 512 having a window is formed on the polished back surface. Thus, the superlattice avalanche photodiode 500 according to the fifth embodiment is finished.

Incident light enters the photodiode 500 from the back surface of the substrate 501 through the window of the film 512 along an arrow A.

With the photodiode 500 according to the fifth embodiment, since the $p^{30}$-diffusion region 514 is formed in the central part of the mesa structure, similar to the first embodiment, the electric-field relaxation effect is highly reduced in the peripheral part of the mesa structure compared with the central part thereof. Therefore, the same effects of advantages can be obtained as those of the first embodiment.

Also, as shown in FIG. 7, since the $p^+$-diffusion region 514 surrounds the entire side face of the mesa structure, interfacial states existing at the side face of the mesa structure (i.e., the interface of the mesa structure with passivation film 513) can be reduced. Accordingly, a reduced initial value of the dark current can be obtained, thereby further restraining the damage of the photodiode 500.

According to the inventor's tests, it was confirmed that the same results as those of the first embodiment were obtained. The dark-current increase rate was smaller than that of the first embodiment due to the p⁺-diffusion region 514.

In the above first to fifth embodiments, an undoped InAlGaAs/InAlAs superlattice carrier multiplication layer that is lattice-matched with InP is employed. However, any other semiconductor layer such as InGaAs/InAlAs, InGaAsP/InAlAs or the like may be employed as the superlattice multiplication layer.

Also, the superlattice carrier multiplication layer may be lightly doped with an n- or p-type impurity if it has a carrier concentration of $5 \times 10^{16}$ atoms/cm$^3$ or less.

Further, although the semiconductor layers are formed by gas-source MBE in the above embodiments, any other epitaxial growth methods such as metal-organic chemical vapor deposition (MOCVD) may be employed.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A superlattice avalanche photodiode with a mesa structure comprising:

a semiconductor substrate of a first conductivity type;

a first semiconductor electric-field buffer layer of said first conductivity type formed at said substrate;

a semiconductor superlattice carrier multiplication layer formed on said first electric-field buffer layer;

a second semiconductor electric-field buffer layer of a second conductivity type opposite to said first conductivity type formed on said carrier multiplication layer;

a semiconductor light-absorbing layer of said second conductivity type formed on said second semiconductor electric-field buffer layer;

at least said light-absorbing layer constituting said mesa structure formed at said substrate;

said first electric-field buffer layer being made of a central part and a peripheral part surrounding said central part, said peripheral part having a greater electric-field relaxation effect than that of said central part;

a first electrode electrically connected to said first electric-field buffer layer; and a second electrode electrically connected to said light-absorbing layer.

2. A superlattice avalanche photodiode as claimed in claim 1, wherein said central part of said first electric-field buffer layer has a thickness greater than that of said peripheral part;

and wherein said relatively thicker central part has a relatively less electric-field relaxation effect and said relatively thinner peripheral part has a relatively greater electric-field relaxation.

3. A superlattice avalanche photodiode as claimed in claim 2, wherein said central part of said first electric-field buffer layer has a thickness that can prevent an electric field generated in said carrier multiplication layer from penetrating said central part;

and wherein said peripheral part of said first electric-field buffer layer has a thickness that allows said electric field to penetrate said peripheral part.

4. A superlattice avalanche photodiode as claimed in claim 2, wherein said thickness of said peripheral part of said first electric-field buffer layer is equal to 95% of said thickness of said central part thereof or less.

5. A superlattice avalanche photodiode as claimed in claim 1, further comprising an electric-field buffer region selectively formed in said central part of said mesa structure;

wherein an electric field is relaxed by only said first electric-field buffer layer in said peripheral part of said mess structure, and said electric field is relaxed by said first electric-field buffer layer and said electric-field buffer region in said central part of thereof.

6. A superlattice avalanche photodiode as claimed in claim 1, further comprising a semiconductor barrier layer of said first conductivity type, said barrier layer being formed at said substrate to be contacted with said first electric-field buffer layer;

wherein said barrier layer includes an electric-field buffer region selectively formed in said central part of said mesa structure.

7. A superlattice avalanche photodiode as claimed in claim 1, further comprising a semiconductor barrier layer of said first conductivity type, said barrier layer being formed at said substrate to be contacted with said first electric-field buffer layer;

wherein said barrier layer includes an electric-field buffer region formed outside said mesa structure;

and wherein said electric-field buffer region is formed at a corresponding position to said central part of said mesa structure.

8. A superlattice avalanche photodiode as claimed in claim 1, further comprising a high electric-resistance region selectively formed in said peripheral part of said mesa structure;

wherein said electric field in said peripheral part of said mesa structure is more relaxed than said central part thereof due to said high electric-resistance region.

9. A superlattice avalanche photodiode as claimed in claim 8, wherein said high electric-resistance region is formed in said first electric-field buffer layer.

10. A superlattice avalanche photodiode as claimed in claim 8, further comprising:

a semiconductor barrier layer of said first conductivity type, said barrier layer being formed at said substrate to be contacted with said first electric-field buffer layer; and a high electric-resistance region selectively formed in said peripheral part of said mesa structure;

wherein said high electric-resistance region is formed in said barrier layer.

11. A superlattice avalanche photodiode as claimed in claim 8, further comprising:

a semiconductor barrier layer of said first conductivity type, said barrier layer being formed at said substrate to be contacted with said first electric-field buffer layer; and a high electric-resistance region selectively formed in said peripheral part of said mesa structure;

wherein said high electric-resistance region is formed to include an interface of said barrier layer and said first electric-field buffer layer.

12. A superlattice avalanche photodiode as claimed in claim 1, further comprising an interfacial-state reducing region selectively formed to cover a side face of said mesa structure;

wherein said interfacial-state reducing region has a function of reducing interfacial states existing at an interface of said mesa structure.

* * * * *